(12) United States Patent
Leem

(10) Patent No.: US 7,776,637 B2
(45) Date of Patent: Aug. 17, 2010

(54) METHOD OF MANUFACTURING LIGHT EMITTING DIODES

(75) Inventor: See jong Leem, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 226 days.

(21) Appl. No.: 11/440,021

(22) Filed: May 25, 2006

(65) Prior Publication Data

US 2006/0270075 A1    Nov. 30, 2006

(30) Foreign Application Priority Data

May 27, 2005    (KR) ...................... 10-2005-0044856

(51) Int. Cl.
    *H01L 21/00*    (2006.01)
    *H01L 21/26*    (2006.01)
(52) U.S. Cl. .................. 438/46; 438/795; 438/977; 438/22; 257/103; 372/44
(58) Field of Classification Search .................. 438/22, 438/46, 977, 795
    See application file for complete search history.

(56) References Cited

U.S. PATENT DOCUMENTS

| 5,563,422 | A | 10/1996 | Nakamura et al. | |
| 6,303,405 | B1 * | 10/2001 | Yoshida et al. | 438/46 |
| 7,112,456 | B2 * | 9/2006 | Park et al. | 438/22 |
| 7,319,247 | B2 * | 1/2008 | Bader et al. | 257/103 |
| 2002/0182839 | A1 * | 12/2002 | Ogawa et al. | 438/604 |
| 2003/0104705 | A1 * | 6/2003 | Fudeta et al. | 438/725 |
| 2004/0031967 | A1 * | 2/2004 | Fudeta et al. | 257/79 |
| 2004/0245543 | A1 | 12/2004 | Yoo | |
| 2005/0040425 | A1 * | 2/2005 | Akita | 257/103 |
| 2005/0042787 | A1 * | 2/2005 | Ito et al. | 438/41 |
| 2005/0242365 | A1 * | 11/2005 | Yoo | 257/103 |

FOREIGN PATENT DOCUMENTS

KR    10-2006-0018764    3/2006

* cited by examiner

*Primary Examiner*—Charles D Garber
*Assistant Examiner*—Pape Sene
(74) *Attorney, Agent, or Firm*—McKenna Long & Aldridge LLP

(57) ABSTRACT

A method of manufacturing a light emitting diode, wherein a laser lift-off (LLO) layer and an epi-layer are formed on a nitride semiconductor substrate, and the nitride semiconductor substrate is then separated through a laser lift-off process, thereby improving the characteristics of the epi-layer and enabling to fabricate a high-grade and high-efficiency light emitting diode. Further, the LLO layer thus prepared is removed using a laser beam so that the relatively expensive nitride semiconductor substrate can be re-used, thereby reducing manufacturing costs.

17 Claims, 14 Drawing Sheets

LASER

METHOD OF MANUFACTURING LIGHT EMITTING DIODES

This application claims priority to Korean Application No. 10-2005-0044856 filed on May 27, 2005, which is incorporated by reference, as if fully set forth herein.

BACKGROUND

This description relates to a method of manufacturing light emitting diodes.

Recently, GaN-based light emitting diodes have attracted attentions as blue and green light emitting diodes. $In_xGa_{1-x}N$ used as an active layer is known as a material that has a wide energy band gap and thus can emit light over an entire range of visible light according to the composition of In.

Such a light emitting diode has a wide range of applications including a sign board, a display device, a device for a backlight, a bulb, and the like, and its range of applications is gradually expanded. Thus, it is of great importance to develop a high-grade light emitting diode.

FIG. 1 is a sectional view schematically showing the configuration of a conventional light emitting diode (LED). An N—GaN layer (101), an active layer (102) and a P—GaN layer (103) are sequentially laminated on a sapphire substrate (100). From the P—GaN layer (103) to the N—GaN layer (101) is mesa-etched. A transparent electrode (104) and a P-metal layer (105) are sequentially formed on the P—GaN layer (103). An N-metal layer (106) is formed on the mesa-etched N—GaN layer (101).

The diode thus constructed is bonded to a molding cup using an adhesive (108). The N-metal layer (106) is wire-bonded to a first lead frame (109a) that is connected to an external lead wire. The P-metal layer (105) is wire-bonded to a second lead frame 109b that is connected to another external lead wire.

Now, operation of the LED will be described. When a voltage is applied through N and P electrodes, electrons and holes flow from the N—GaN layer (101) and the P—GaN layer (103) into the active layer (102) where the electrons and holes are re-combined to emit light.

The active layer (102) emits light through the top, bottom and lateral surface portions thereof. Light emitted through the top portion of the active layer emerges to the outside through the P—GaN layer (103).

However, since the LED is fabricated on a sapphire substrate having low thermal conductivity, it is difficult to smoothly dissipate heat produced during the operation of the device operation, resulting in degradation of characteristics of the device.

In addition, as shown in FIG. 1, electrodes cannot be formed on the top and bottom of the device and thus should be formed on the top of the device. Thus, a portion of the active layer should be removed. Accordingly, there are problems in that a light emitting area is reduced, it is difficult to implement a high-luminance and high-grade LED, the number of chips obtained from one wafer is decreased, a manufacturing process is complicated, and bonding should be performed twice during assembly.

Furthermore, after processes for LED chips are completed on a wafer, lapping, polishing, scribing and breaking processes are carried out to divide the wafer into unit chips. At this time, if a sapphire substrate is used as a substrate, there is a problem of yield reduction due to stiffness of sapphire and mismatch of cleavage planes between sapphire and GaN.

FIGS. 2a to 2e are sectional views illustrating a method of manufacturing a conventional improved LED.

First, as shown in FIG. 2a, an undoped GaN layer (122), an N—GaN layer (123), an $In_xGa_{1-y}N$ layer (124), and a P—GaN layer (125) are sequentially formed on the sapphire substrate (121) using an MOCVD process.

Here, the N—GaN layer (123), the $In_xGa_{1-y}N$ layer (124), and the P—GaN layer (125) constitute a basic light emitting structure.

Then, sequentially formed on the P—GaN layer (125) are a transparent electrode (126), a reflective film (127), a solder-reaction inhibition layer (128), and a metal layer (129) made of any one selected from Ti/Au, Ni/Au, and Pt/Au.

Thereafter, a base substrate (130) through which a current can flow is prepared. The base substrate (130) has first and second ohmic contact metal layers (131, 132) formed respectively on the top and bottom thereof. A solder (133) for attachment of an LED chip is formed on the first ohmic contact metal layer (131).

Then, the metal layer (129) of the light emitting structure is bonded to the solder (133) of the base substrate (130), as shown in FIG. 2a.

Subsequently, laser is irradiated on the sapphire substrate (121) to separate the sapphire substrate (121) from the undoped GaN layer (122) (FIG. 2b).

Thus, through the laser irradiation, the sapphire substrate (121) is entirely removed from the undoped GaN layer (122). The undoped GaN layer (122) remains as a layer damaged from the surface thereof to a certain thickness. (FIG. 2c).

Therefore, as shown in FIG. 2d, the undoped GaN layer (122) is etched through a dry-etching process until the N—GaN layer (123) is exposed. Then, an N-electrode pad 141 is formed on the N—GaN layer (123) (FIG. 2d).

At this time, in order to form a plurality of LEDs, a plurality of N-electrode pads. (141) each spaced apart from one another are formed on the N—GaN layer (123).

Finally, cutting processes such as scribing and breaking are performed between the N-electrode pads (141) from the N—GaN layer (123) to the second ohmic contact metal layer (132), thereby obtaining separate devices (150, 160) (FIG. 2e).

However, this conventional technique also has the following problems.

That is, since the sapphire substrate is used as a substrate for forming an epi-layer thereon, lattice mismatch between GaN of the epi-layer and sapphire degrades the quality of the epi-layer, causing a lowered light emitting efficiency, a reduced electrostatic damage (ESD) level, deteriorated reliability, and the like.

In addition, although a nitride semiconductor substrate has been studied as an alternative substrate in order to solve the problems with this sapphire substrate, there is no substantial success. Since this nitride semiconductor substrate is expensive, the use thereof as disposables leads to a problem of increased manufacturing costs.

SUMMARY

The present invention is conceived to solve the aforementioned problems in the prior art. It is an object of the present invention to provide a method of manufacturing a light emitting diode, wherein a laser lift-off (LLO) layer and an epi-layer are formed on a nitride semiconductor substrate, and the nitride semiconductor substrate is separated through a laser lift-off process to improve the characteristics of the epi-layer, thereby enabling fabrication of a high-grade and high-efficiency light emitting diode.

It is another object of the invention to provide a method of inexpensively manufacturing a light emitting diode, wherein a prepared LLO layer is removed using a laser so that a relatively expensive nitride semiconductor substrate can be re-used, thereby reducing manufacturing costs.

It is a further object of the invention to provide a method of manufacturing a light emitting diode, wherein an LLO layer is formed between a substrate and a light emitting structure, and the LLO layer is removed by irradiating a laser beam thereon, thereby smoothing an interface of the light emitting structure with which the removed LLO layer was in contact.

According to a first preferred aspect of the present invention for achieving the objects, there is provided a method of manufacturing a light emitting diode, comprising: forming a laser lift-off (LLO) layer to be removed by a laser beam irradiated on a substrate, forming on the LLO layer a first layer with a first polarity, an active layer, and a second layer with a second polarity opposite to the first polarity, and removing the LLO layer by irradiating a laser through the substrate on the LLO layer to separate the substrate.

According to a second preferred aspect of the present invention for achieving the objects, there is provided a method of manufacturing a light emitting diode, comprising: forming a laser lift-off (LLO) layer made of at least one of GaN, InGaN, AlGaN and InAlGaN and a first semiconductor layer on a nitride semiconductor substrate, forming, on the first semiconductor layer, an active layer, a second semiconductor layer and a first electrode, carrying out a laser lift-off process in which a laser beam is irradiated on the LLO layer through the nitride semiconductor substrate to separate the nitride semiconductor substrate, and forming a second electrode underneath a bottom of the first semiconductor layer.

According to a third preferred aspect of the present invention for achieving the objects, there is provided a method of manufacturing a light emitting diode, comprising: forming a laser lift-off (LLO) layer made of at least one of GaN, InGaN, AlGaN and InAlGaN and a first semiconductor layer on a nitride semiconductor substrate, forming an active layer and a second semiconductor layer on the first semiconductor layer, forming a carrier on the second semiconductor layer, carrying out a laser lift-off process in which a laser beam is irradiated on the LLO layer through the nitride semiconductor substrate to separate the nitride semiconductor substrate, removing the carrier formed on the second semiconductor layer; and forming an electrode on the second semiconductor layer.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION

Hereinafter, preferred embodiments of the present invention will be described in detail with reference to the accompanying drawings.

Figure 3A:
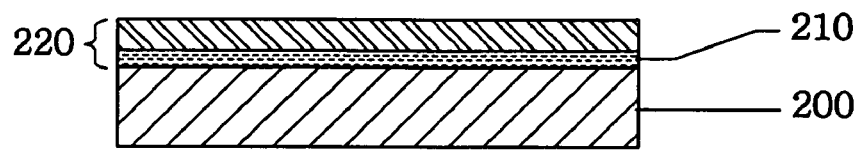
FIGS. 3a to 3c are sectional views illustrating a method of manufacturing a light emitting diode according to the present invention.
Figure 3B:
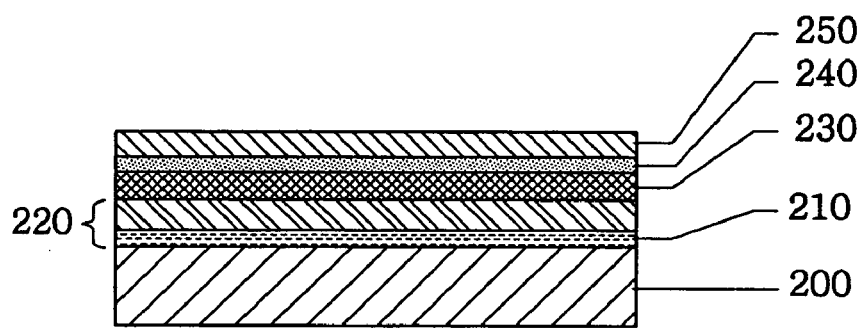
Figure 3C:
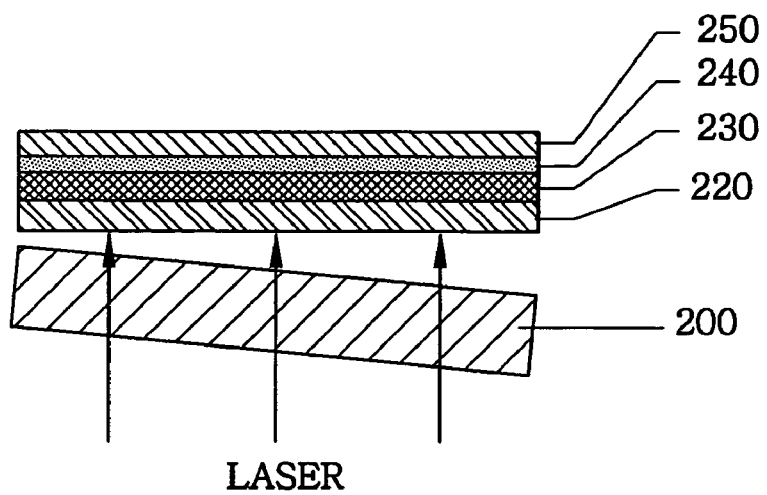

FIGS. 3a to 3c are sectional views illustrating a method of manufacturing a light emitting diode according to the present invention. First, a substrate (200) is formed with a semiconductor film (220) including a laser lift-off (LLO) layer (210) that is to be removed by a laser beam irradiated thereon (FIG. 3a).

Thereafter, a first layer (230) with a first polarity, an active layer (240), and a second layer (250) with a second polarity opposite to the first polarity are formed on the semiconductor film (220) (FIG. 3b).

At this time, in the processes of FIGS. 3a and 3b, the substrate (200) may be formed thereon only with the LLO layer (210), and the LLO layer (220) may be formed thereon with the first layer (230) with a first polarity, the active layer (240) and the second layer (250) with the second polarity opposite to the first polarity.

Then, a laser beam is irradiated on the LLO layer (210) through the substrate (200) to remove the LLO layer (210) so that the substrate (200) can be separated (FIG. 3c).

Here, a metallic structure or a structure containing a metal is further formed on the second layer (250). A light emitting structure comprising the first layer (230), the active layer (240) and the second layer (250) can be securely held by the metallic structure or the structure containing a metal in the process of separating the substrate (200) shown in FIG. 3c. At this time, the metallic structure is preferably formed on the second layer (250) by carrying out a process including at least one of a deposition process and a growth process, or by bonding the structure on the second layer.

That is, a metal is deposited on the second layer (250) to form a metallic structure. Alternatively, a material such as AlGaN containing a metal or a material such as a compound semiconductor except metal is grown on the second layer (250) and a metal is then deposited to form a structure.

Therefore, in the present invention, an LLO, which can be completely removed by a laser beam, is interposed between a light emitting structure and a substrate to be removed, thereby providing an advantage of easy removal of the substrate.

Figure 4A:
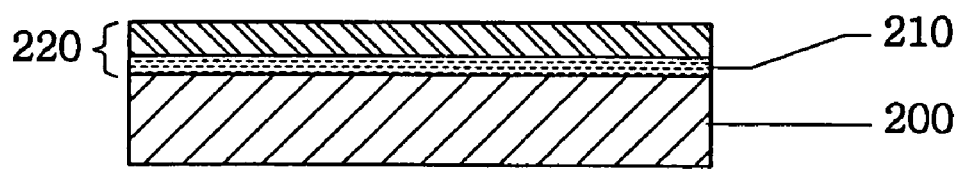
FIGS. 4a and 4b are sectional views illustrating a method of manufacturing a light emitting diode according to the present invention.
Figure 4B:
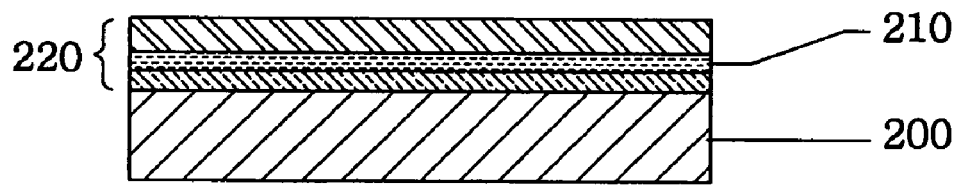

FIGS. 4a and 4b are sectional views illustrating a method of manufacturing a light emitting diode according to the present invention. It is preferred that the LLO layer (210) be in contact with the substrate (200) to be separated as shown in FIG. 4a, or placed inside the semiconductor film (220) as shown in FIG. 4b.

Figure 5A:
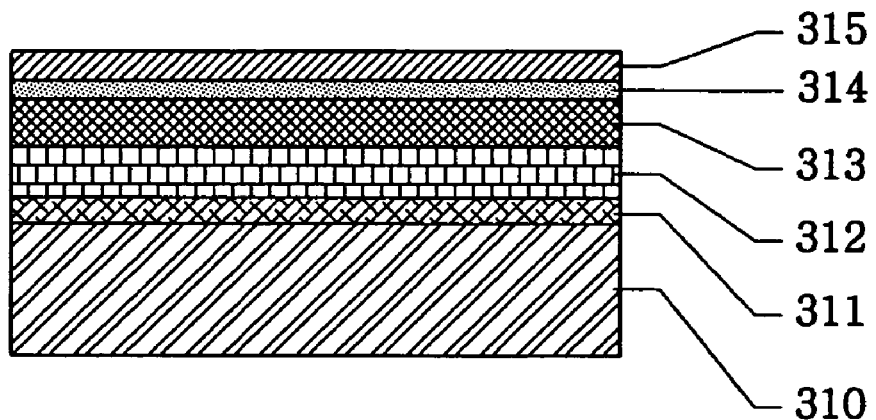
FIGS. 5a and 5b are sectional views illustrating some processes of manufacturing a light emitting diode according to a first embodiment of the present invention.
Figure 5B:
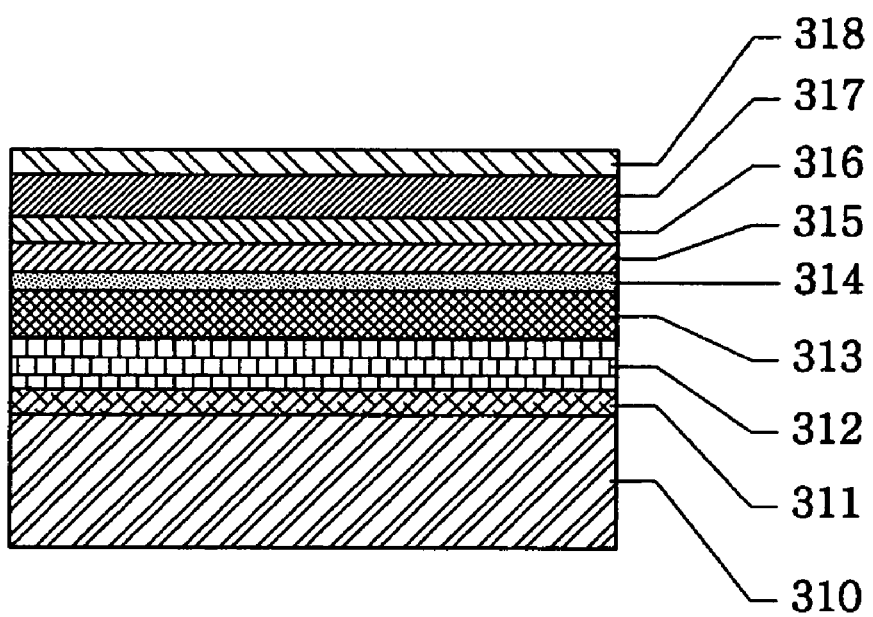

FIGS. 5a and 5b are sectional views illustrating some processes of manufacturing a light emitting diode according to a first embodiment of the present invention. An LLO layer (311), an undoped GaN layer (312), an N—GaN layer (313), an active layer (314), a P—GaN layer (315) are laminated on a nitride semiconductor substrate (310) using an MOCVD process. Heat treatment is carried out for about 20 minutes at 600° C. to activate impurities of the P—GaN layer (315) (FIG. 5a).

The active layer (314) is formed of $In_xGa_{1-x}N$ or the like.

The nitride semiconductor substrate (310) is a substrate made of semiconductor nitrides and a combination thereof, preferably any one material selected from GaN, InGaN, AlGaN and AlInGaN to improve characteristics of an epi-layer.

In addition, the nitride semiconductor substrate (310) may be a template substrate where at least one of GaN, InGaN, AlGaN and AlInGaN is laminated on a sapphire substrate, a silicon substrate, a ZnO substrate or a nitride semiconductor substrate.

The at least one of GaN, InGaN, AlGaN and AlInGaN laminated on the template substrate preferably has a thickness of 0.001~100 μm.

The LLO layer (311) may be formed of at least one selected from the group consisting of GaN, InGaN, AlGaN, AlInGaN, and a combination thereof.

In order to absorb a laser passing through the nitride semiconductor substrate (310), the LLO layer (311) preferably has a controlled composition ratio of Ga, In, Al and the like so as to have an energy band gap larger than that of the nitride semiconductor substrate (310) and smaller than that of the active layer (314).

In order words, the LLO layer (311) has an energy band gap corresponding to a wavelength longer than that corresponding to the energy band gap of the nitride semiconductor substrate (310) and shorter than that corresponding to the energy band gap of the active layer (314).

That is, in a case where the nitride semiconductor substrate 310 is made of GaN, it is preferred that the LLO layer (311) be fabricated to have an energy band gap corresponding to a wavelength of 350~1,000 nm. In case of an AlGaN substrate, the LLO layer is preferably fabricated to have an energy band gap corresponding to a wavelength of 200~1,000 nm.

In addition, the LLO layer (311) does not have specific limitation on its thickness but preferably has a thickness of 1 Å~3 μm.

Thereafter, a P-ohmic contact material (316) and then a UBM layer (318) are formed on the P—GaN layer (315). Preferably, a reflective metal (317) is formed on the P-ohmic contact material (316) in view of light efficiency (FIG. 5b).

Here, the ohmic contact material is to form an electrode.

The ohmic contact material is provided for maintaining high transmittance and simultaneously forming good ohmic contact in case of formation of an electrode on the GaN layer. All ohmic contact materials known in the art may be used.

Preferably, the reflective layer (317) may be any material so far as the material can reflect light, but is preferably formed of at least one selected from Ag, Al, Pt, Au, Ni, Ti, ATO ($SnO_2$ doped with Sb), and ITO. It is preferred that the reflective metal (317) have a thickness of 0.2 μm or more.

In other words, the reflective layer (317) is preferred to be one material selected from Ag, Al, Pt, Au, Ni, Ti and transmissive conductive oxide, or a combination thereof.

Preferably, the UBM layer (318) is formed of a laminated structure such as Ti/Pt/Au, or any one laminated structure selected from Ti/Au, Ni/Au and Pt/Au.

A light emitting structure has been fabricated on a nitride semiconductor substrate in such a manner.

The light emitting structure is a light emitting structure for use in manufacturing at least one light emitting diode, such as a light emitting structure for use in manufacturing a plurality of light emitting diodes on a wafer basis, or a light emitting structure for use in manufacturing a single light emitting diode.

Figure 6A:
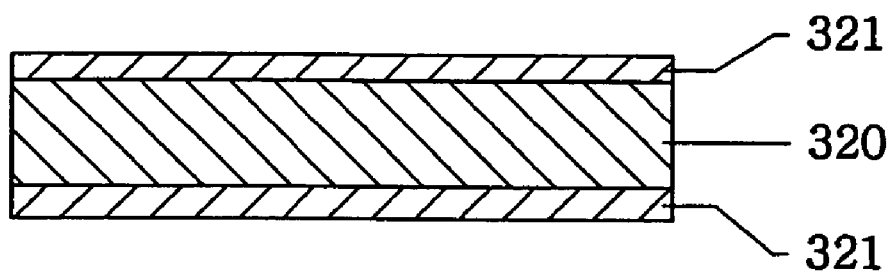
FIGS. 6a and 6b are sectional views illustrating a method of manufacturing a submount substrate as a kind of support in accordance with the first embodiment of the present invention.
Figure 6B:
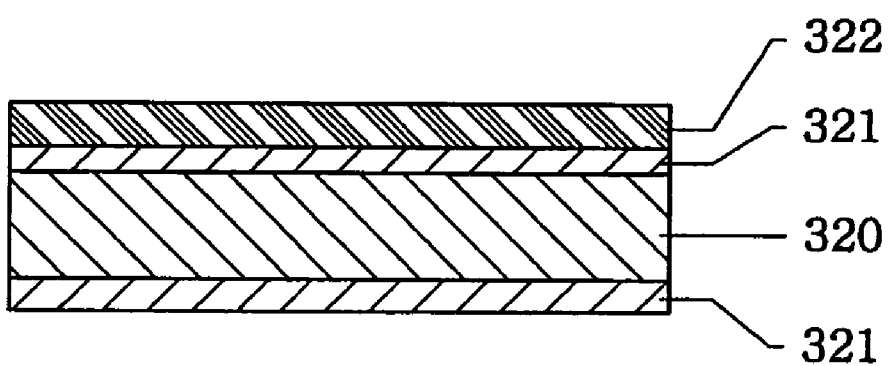

FIGS. 6a and 6b are sectional views illustrating a method of manufacturing a submount substrate as a kind of support in accordance with the first embodiment of the present invention. First, in order to manufacture a submount substrate, ohmic-contact materials (321) are formed respectively on and beneath a conductive substrate (320) through which an electric current can flow (FIG. 6a).

The conductive substrate (320) is formed of a material with good thermal conductivity, preferably with good electrical conductivity, more preferably with a thermal expansion coefficient similar to that of the epi-layer. Preferably, the conductive substrate (320) includes at least one of Si, AlN, SiC, GaAs, Cu, W and Mo.

Then, a solder (322) is formed on the conductive substrate (320) with the ohmic-contact material (321) formed thereon (FIG. 6b).

In this way, the fabrication of the submount substrate as a kind of support is completed.

Figure 7A:
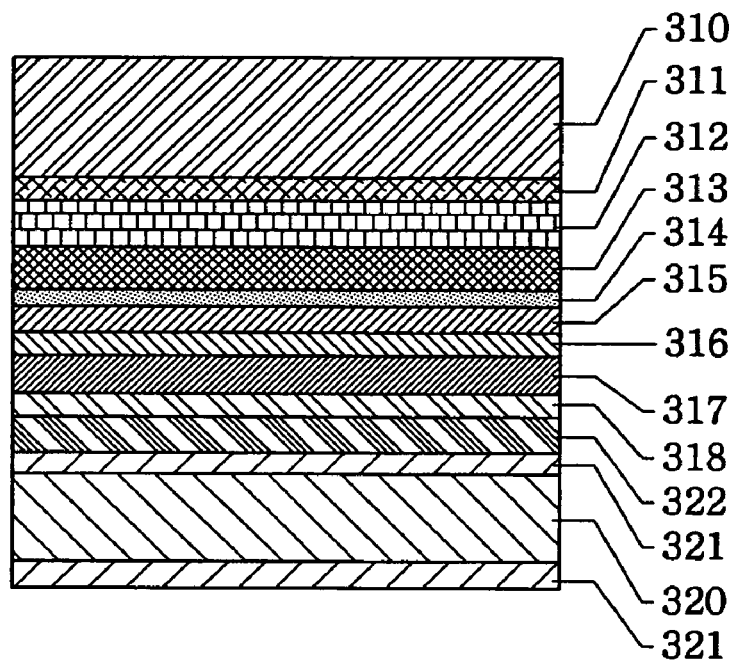
FIGS. 7a to 7e are sectional views illustrating a method of manufacturing a light emitting diode using the submount substrate in accordance with the first embodiment of the present invention.

FIGS. 7a to 7e are sectional views illustrating a method of manufacturing a light emitting diode using the submount substrate in accordance with the first embodiment of the present invention. As shown in FIG. 7a, the light emitting structure is turned over and laminated on and bonded to the submount substrate such that the UBM layer (318) is brought into-contact with the solder (322) of the submount substrate.

The light emitting structure herein refers to a structure where a plurality of light emitting diodes are fabricated on a nitride semiconductor substrate using the processes of FIGS. 5a to 5e.

Figure 7B:
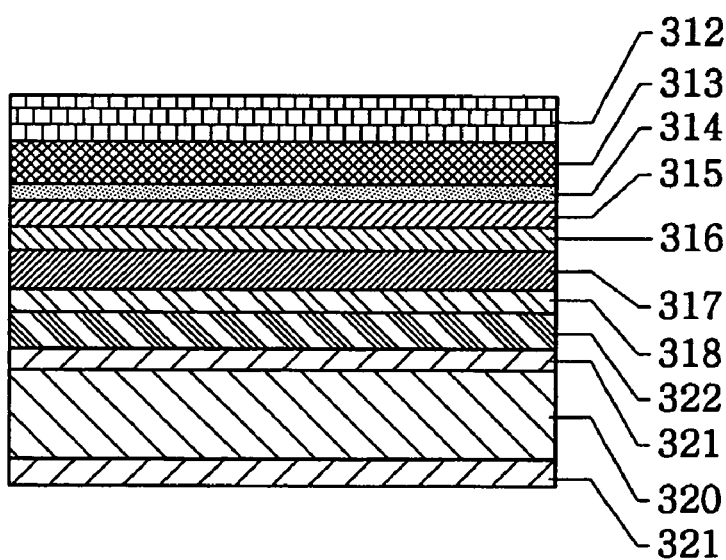
Figure 7C:
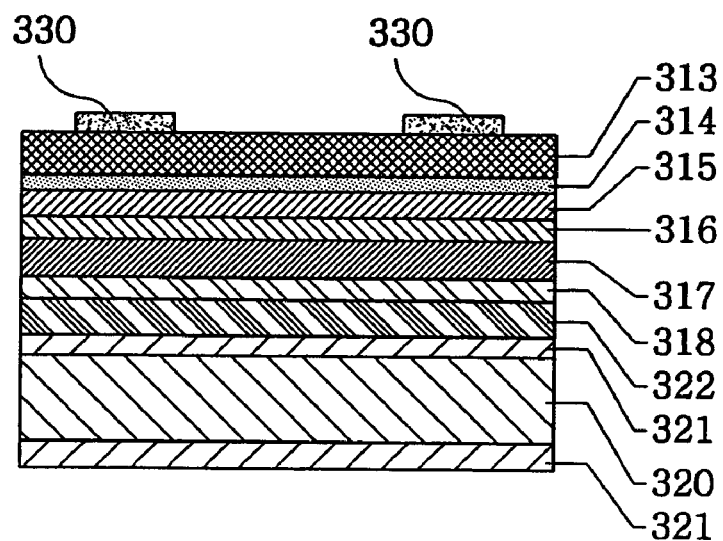

Thereafter, a laser is irradiated on the LLO layer (311) through the nitride semiconductor substrate (310) of the light emitting structure to separate the nitride semiconductor substrate (310) from the light emitting structure (FIG. 7b).

At this time, the irradiated laser passes through the nitride semiconductor substrate (310) and is absorbed by the LLO layer (311), so that the components of the LLO layer (311), i.e., (Al) (In) GaN and the like, can be divided into Ga, $N_2$ and the like, thereby causing the separation of the nitride semiconductor substrate (310).

Therefore, the nitride semiconductor substrate (310) is separated from the light emitting structure.

Here, the undoped GaN layer (312), which has been exposed due to the separation of the nitride semiconductor substrate (310), is etched over the whole surface using a dry-etching process until the N—GaN layer (313) is exposed. Then, heat treatment is carried out in order to recover a lattice loss occurring during the etching process.

The used laser has a wavelength shorter than that corresponding to the band gap energy of the LLO layer and longer than that corresponding to the band gap energy of the nitride semiconductor substrate (310). Preferably, the laser wavelength is in a wavelength range corresponding to the band gap energy of the LLO layer (311).

In this way, the laser transmits the nitride semiconductor substrate (310) and is absorbed by the LLO layer (311) where the nitride semiconductor substrate (310) along with the LLO layer (311) is separated.

In addition, since the nitride semiconductor substrate (310) is not damaged by the laser, the separated nitride semiconductor substrate (310) can be re-used, thereby significantly reducing manufacturing costs.

Thereafter, N-ohmic contact materials (330) are formed on upper portions of the N—GaN layer (313), which correspond to the respective light emitting diodes. Then, it is preferred that the N-ohmic contact material (330) be formed in a radialized shape for distribution of an electric current.

The N-ohmic contact materials (330) are used as N-electrodes.

Figure 7D:
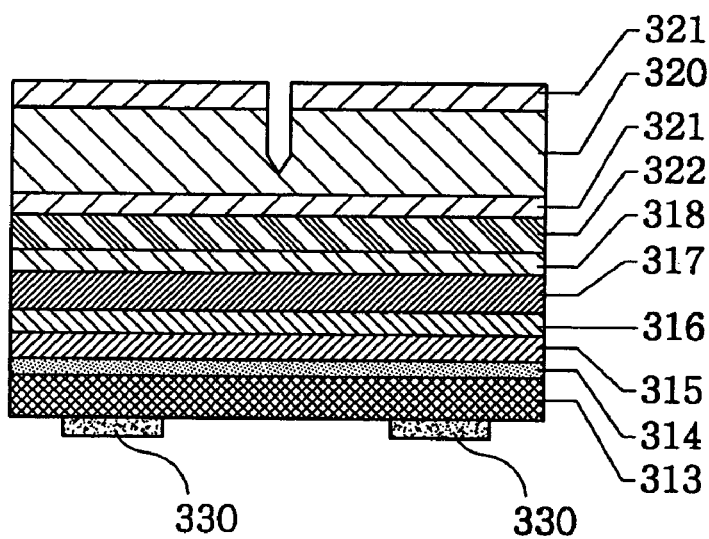
Figure 7E:
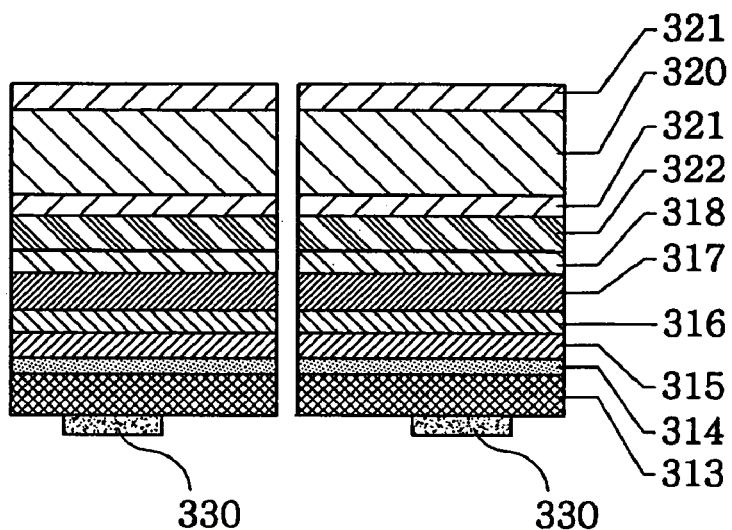

Finally, cutting processes including scribing and breaking are performed on the light emitting structure and the submount substrate to achieve separation thereof into individual devices (FIGS. 7d and 7e).

Therefore, the light emitting diode of the present invention is manufactured to have a structure in which electrodes are provided at the top and bottom thereof. Thus, there is an advantage in that a manufacturing process is simplified since a conventional etching process is not performed.

In addition, an epi-layer is formed on the nitride semiconductor substrate, thereby solving a problem of quality degradation caused by lattice mismatch of the sapphire substrate. Furthermore, the nitride semiconductor substrate can be re-used through a specialized laser lift-off process, thereby significantly reducing manufacturing costs.

That is, the method of manufacturing the light emitting diode according to the first embodiment of the present invention comprises the steps of: forming, on a nitride semiconductor substrate, a laser lift-off (LLO) layer made of at least one material of GaN, InGaN, AlGaN and InAlGaN, and a first semiconductor layer; forming, on the first semiconductor layer, an active layer, a second semiconductor layer and a first electrode; carrying out a laser lift-off process in which a laser beam is irradiated on the LLO layer through the nitride semiconductor substrate to remove the LLO layer and to separate the nitride semiconductor substrate; and forming a second electrode on the second semiconductor layer.

Here, the first semiconductor layer is a semiconductor layer with a polarity different from that of the second semiconductor layer. For example, if the first semiconductor layer is an n-type, the second semiconductor layer is a p-type.

In addition, it is preferred that the method further include the step of forming a metallic support on the first electrode, between the first electrode forming step and the laser lift-off step.

Furthermore, before carrying out the laser lift-off step, the method further includes the steps of forming an Under Bump Metalization (UBM) layer and bonding the support to the UBM layer.

Here, the support is equivalent to, the aforementioned submount substrate.

Figure 8:
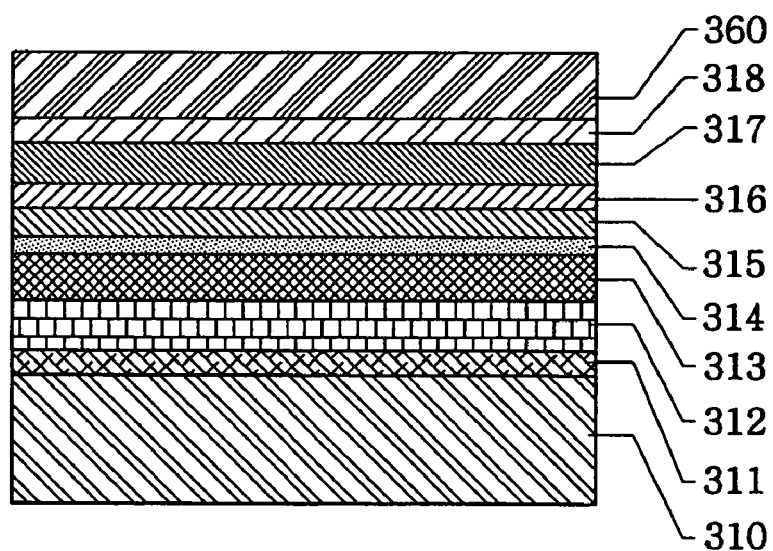
FIG. 8 is a sectional view illustrating a method of manufacturing a light emitting diode using a metallic support in accordance with the first embodiment of the present invention.

FIG. 8 is a sectional view illustrating a method of manufacturing a light emitting diode using a metallic support in accordance with the first embodiment of the present invention. As illustrated in FIG. 8, a metallic support (360) may be used instead of the aforementioned submount substrate.

That is, the metallic support (360) is formed on the P-ohmic contact material (316). Then, a laser beam is irradiated on the LLO layer (311) through the nitride semiconductor substrate (310) to separate the nitride semiconductor substrate (310).

In this structure, a un-GaN layer (312) may be further included. The reflective layer (317) and the UBM layer (318) may be omitted. Various modifications may be made through addition or omission of a certain element to or from the configuration of the previous embodiment.

In addition, the metallic support (360) may be deposited through a MOCVD method, and more preferably and more conveniently through an electroplating method. The electroplating process is well-known in the art and thus details thereon will not be described herein.

Therefore, the metallic support (360) is formed by any one method of an electroplating method, an electroless plating method, a CVD method, a sputtering method and an evaporating method.

It is preferred that the metallic support (360) have a thickness in the range of 10~400 μm, but it is not limited thereto The metallic support (360) is not limited to a specific material but may be formed of any material so far as the material has a thermal expansion coefficient similar to the epi-layer and superior electrical and thermal conductivity, preferably formed of at least one selected from a group consisting of Cu, W, Au, Ni, Mo, Pt, Al, Co, Pd, Ag and Ti.

FIGS. 9a to 9d are sectional views illustrating a method of manufacturing a light emitting diode according to a second embodiment of the present invention. A carrier (371) is bonded to a P—GaN layer (315). After a nitride semiconductor substrate (310) is removed, and then the carrier (371) is removed.

Figure 9A:
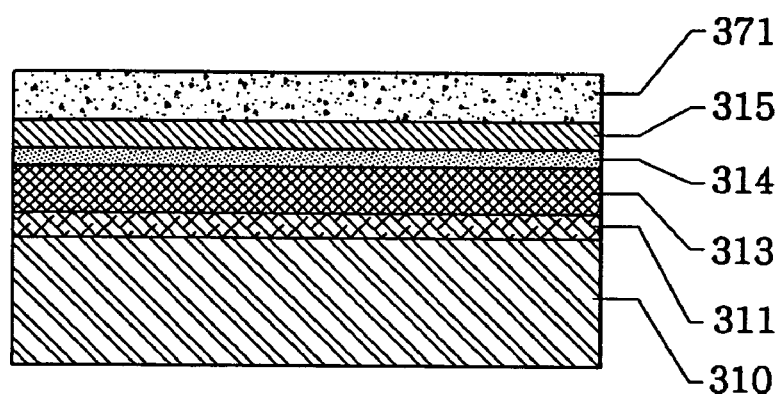
FIGS. 9a to 9d are sectional views illustrating a method of manufacturing a light emitting diode according to a second embodiment of the present invention.

First, as illustrated in FIG. 9a, a laser lift-off (LLO) layer formed of at least one of GaN, InGaN, AlGaN and InAlGaN and an N—GaN layer (313) are formed on the nitride semiconductor substrate (310). An active layer (314) and a P—GaN layer (315) are laminated on the N—GaN layer (313). The carrier (371) is formed on the P—GaN layer (315).

Figure 9B:
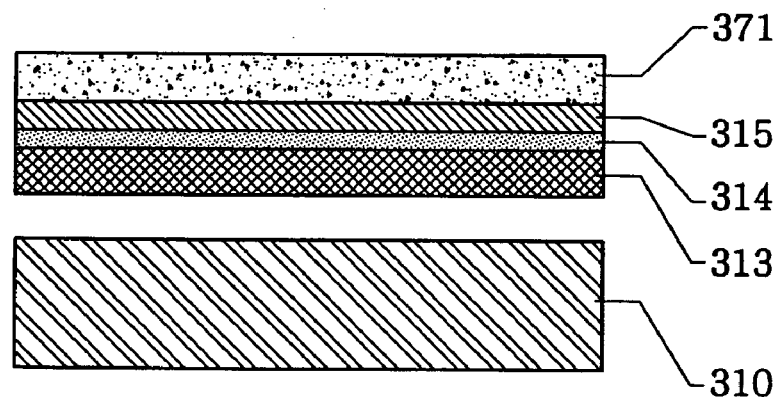

Thereafter, a laser beam is irradiated on the LLO layer (311) through the nitride semiconductor substrate (310) to perform a laser lift-off process for separating the nitride semiconductor substrate (310), so that the nitride semiconductor substrate (310) can be separated (FIG. 9b).

Figure 9C:
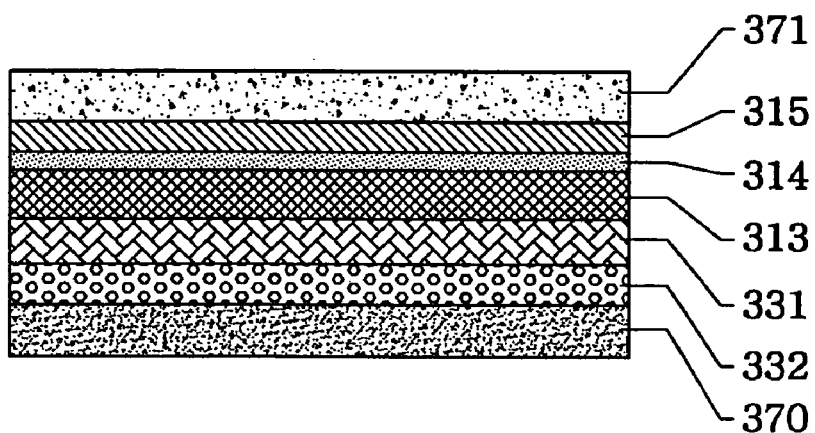

Then, an N-ohmic contact layer (331), a reflective layer (332) and a metallic support 370 are formed underneath the N—GaN layer (313) (FIG. 9c).

Here, the formation of the N-ohmic contact layer (331) and the reflective layer (332) may be omitted.

Figure 9D:
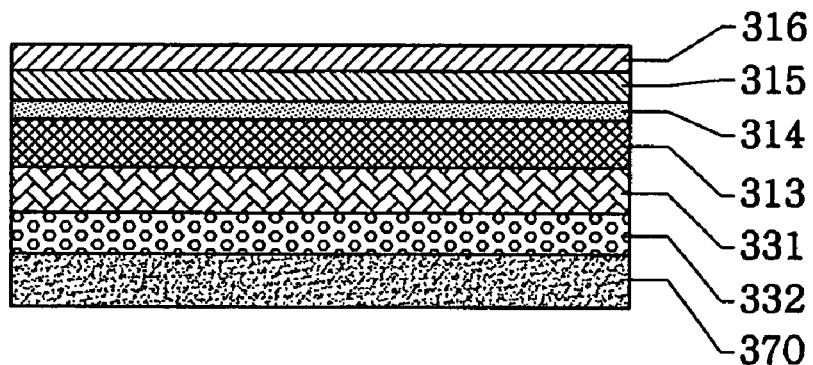

Successively, the carrier (371) formed on the P—GaN layer (315) is removed, and a P-ohmic contact layer (316) is formed on the P—GaN layer (315) (FIG. 9d).

Meanwhile, according to still another embodiment of the present invention, a metallic support may be interposed between the P—GaN layer (315) and the carrier (371) in FIG. 9a, and the LLO process may be performed as shown in FIG. 9b.

In the afore-mentioned method, an un-GaN layer (312) may be further interposed between the LLO layer (311) and the N—GaN layer (313). The metallic support (370) is formed in the same manner as that of the aforesaid method, and its material and thickness are the same as those previously described. In addition, a P-ohmic layer (316) may be first formed on the P—GaN layer (315) and a carrier may then be bonded to the P-ohmic contact layer (316). In addition to the foregoing, various modifications may be made through addition or omission of a certain element to or from the configuration of the previous embodiment.

Since the carrier (371) is removed in a subsequent process, there is no specific limitation on its material. Any materials may be selected so far as they can move the LED layer for subsequent processes.

Preferably, the carrier (371) comprises any one of a glass substrate, a sapphire substrate, a silicon substrate, a ZnO substrate and a nitride semiconductor substrate; a template substrate in which at least one of GaN, InGaN, AlGaN and AlInGaN is laminated on any one of a glass substrate, a sapphire substrate, a silicon substrate, a ZnO substrate and a nitride semiconductor substrate; or any one of a metallic substrate and a stainless steel substrate.

In addition, a film made of a resin such as polyurethane, polyvinyl or PET may be used for the carrier (371).

The carrier (371) is bonded to the top of the P—GaN layer (315) using an adhesive substance.

The adhesive substance may be selected from any materials so far as the materials can be used for bonding the carrier (371) and then be easily removed using an organic solvent to separate the carrier. Photoresist or wax is preferably used for the adhesive substance. The organic solvent may be any organic solvents so far as they can dissolve the adhesive substance, and is preferably an organic solvent containing acetone.

In addition, in the case where the metallic support is formed on the N—GaN layer as described above, electric resistance is relatively decreased, which is advantageous to power consumption.

The present invention is not limited to the above embodiments. Various modifications made by those skilled in the art fall within the scope of the present invention.

Therefore, the method of manufacturing the light emitting diode according to the second embodiment of the present invention includes the steps of: forming, on a nitride semiconductor substrate, a laser lift-off (LLO) layer formed of at least one of GaN, InGaN, AlGaN and InAlGaN, and a first semiconductor layer; forming, on the first semiconductor layer, an active layer and a second semiconductor layer; forming a carrier on the second semiconductor layer; carrying out a laser lift-off process in which a laser beam is irradiated on the LLO layer through the nitride semiconductor substrate to separate the nitride semiconductor substrate; forming a metallic support on the first semiconductor layer; removing the carrier formed on the top of the second semiconductor layer; and forming an electrode on the second semiconductor layer.

Figure 10A:
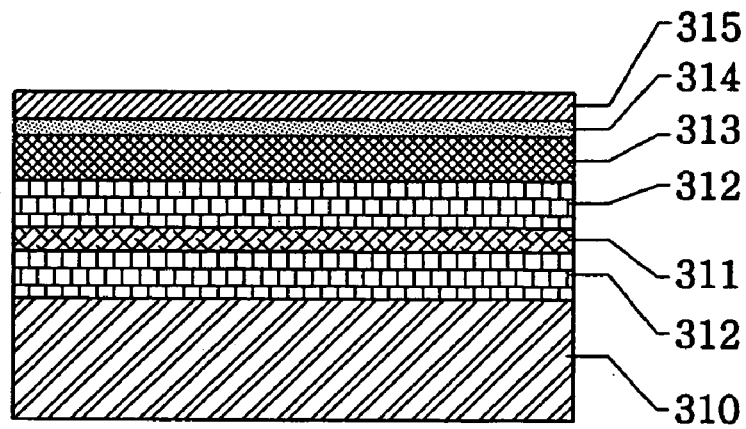
FIGS. 10a and 10b are sectional views showing an example of a variant of the light emitting diode according to the present invention.
Figure 10B:
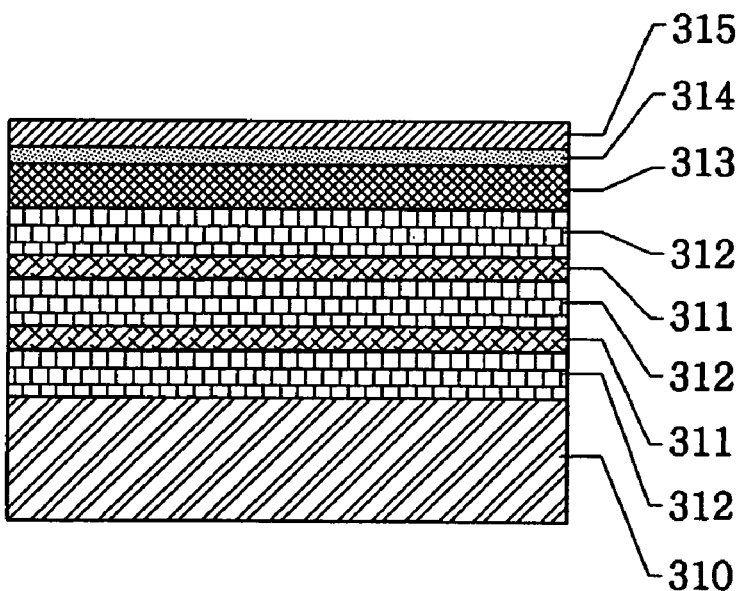

FIGS. 10a and 10b are sectional views showing an example of a variant of the light emitting diode according to the present invention. That is, as illustrated in these figures, an LLO layer (311) may be formed to exist within an un-GaN layer (312).

Here, the un-GaN layer (312) is an undoped GaN layer.

That is, the un-GaN layer (312) may be first formed on a nitride semiconductor substrate (310), the LLO layer (311) may be then formed, and the un-GaN layer (312) may be formed again.

Figure 1:
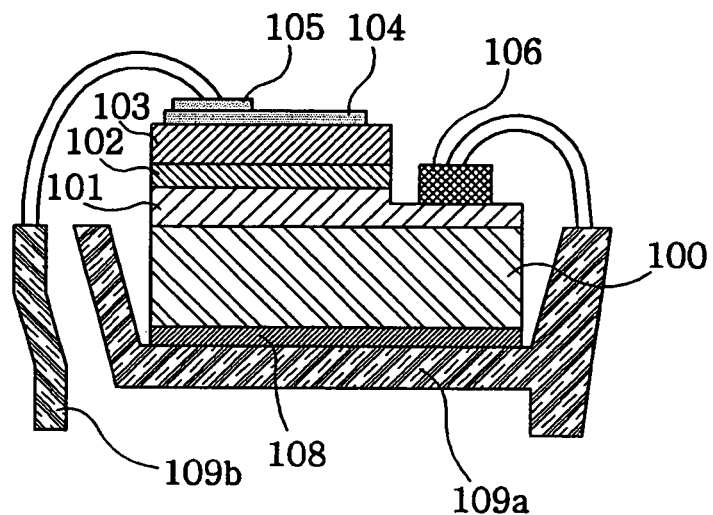
FIG. 1 is a sectional view schematically showing the configuration of a conventional light emitting diode.
Figure 2A:
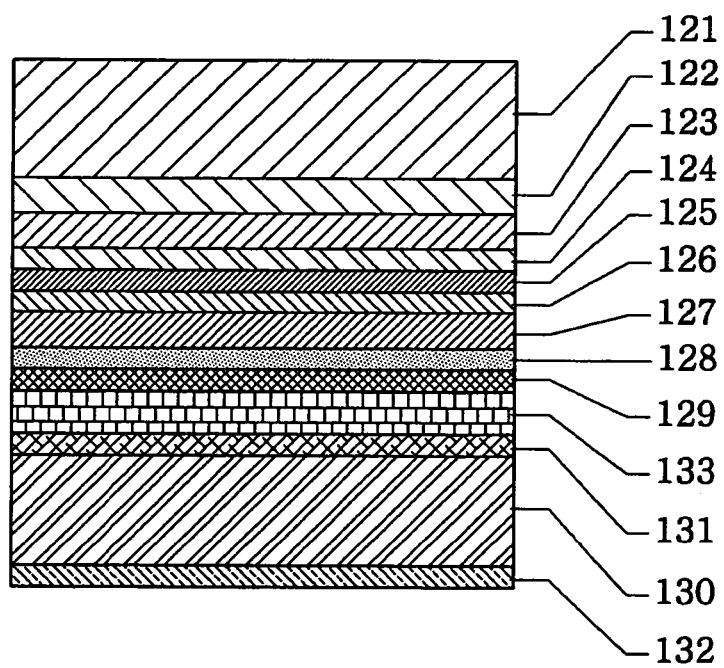
FIGS. 2a to 2e are sectional views illustrating a method of manufacturing a conventional improved light emitting device.
Figure 2B:
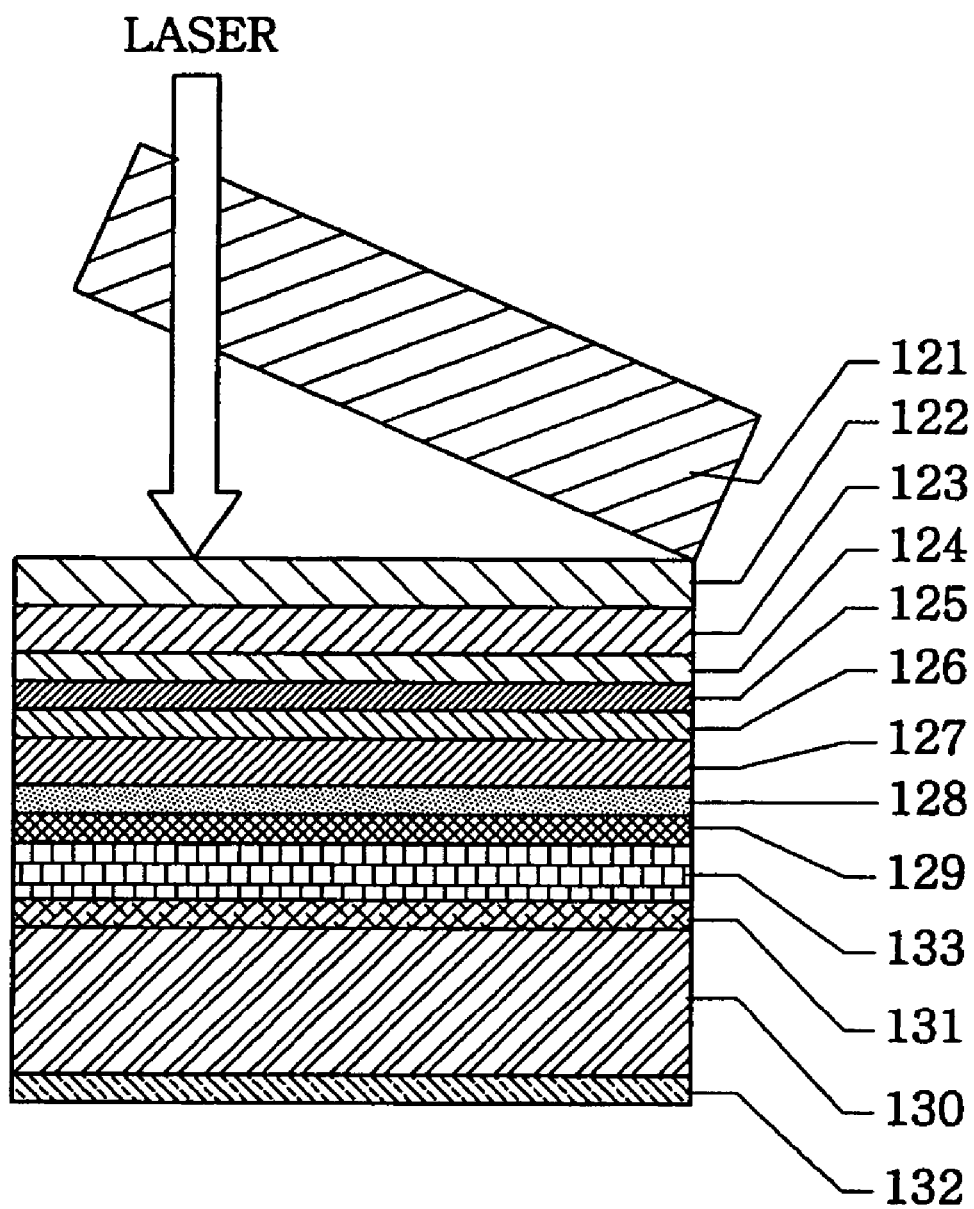
Figure 2C:
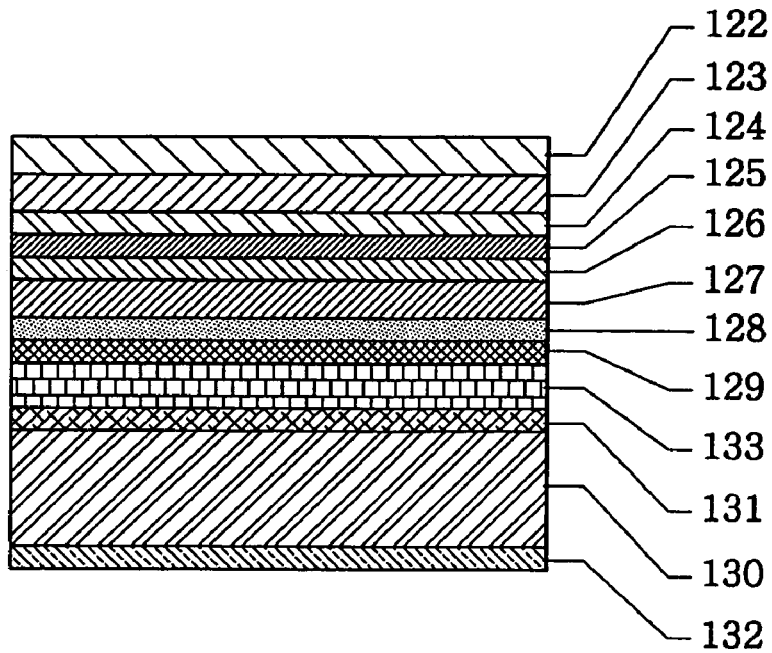
Figure 2D:
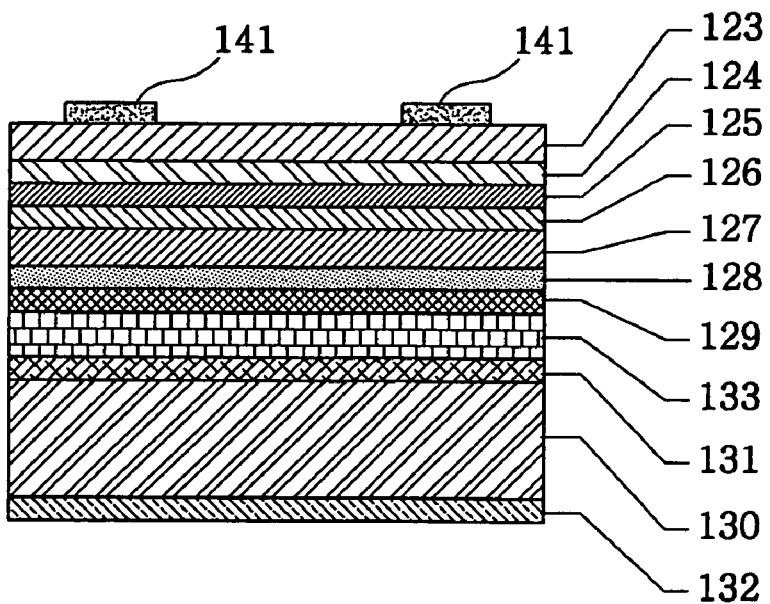
Figure 2E:
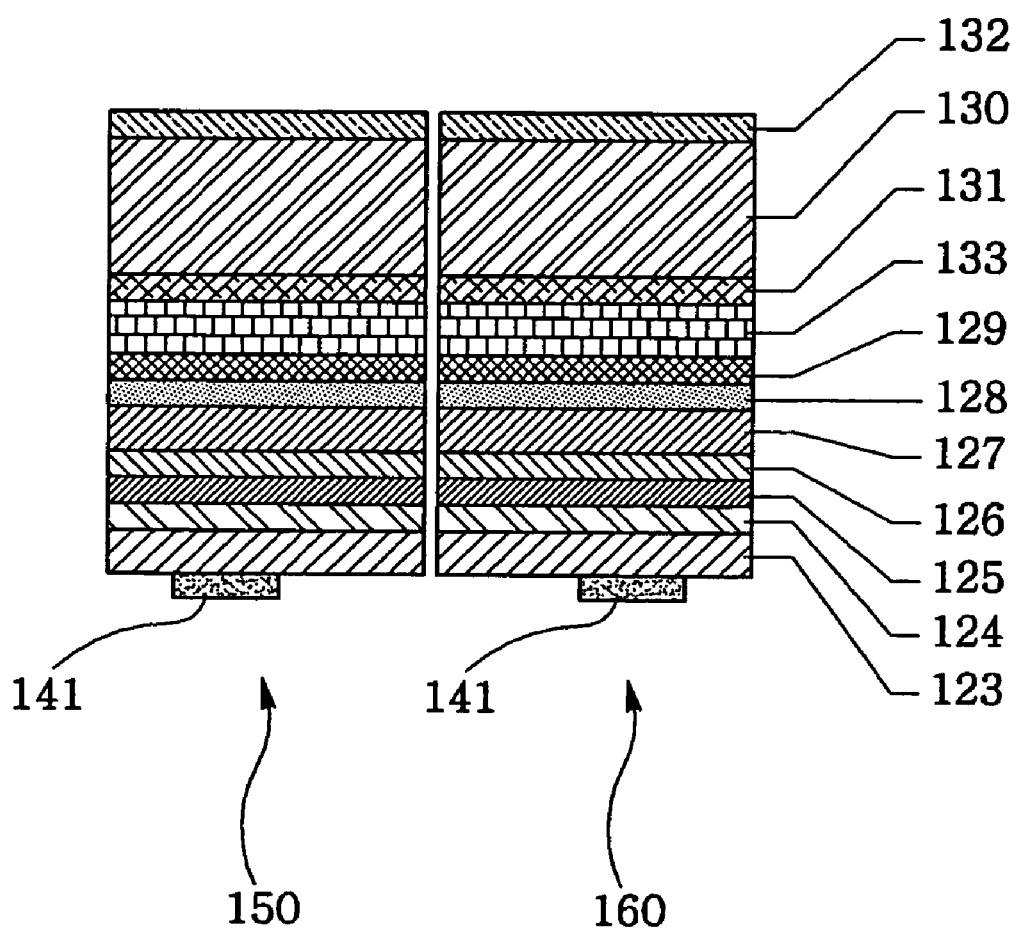

In this case, the LLO layer (311) is preferably placed close to the nitride semiconductor substrate (310). It is preferred that the distance between the LLO layer (311) and the nitride semiconductor substrate (310) be in a range of 1~10 μm (FIG. 1a) A plurality of LLO layers (311) may be formed as illustrated in FIG. 10b.

In addition, the un-GaN layer (312) that is an undoped semiconductor layer may be formed on the top of the LLO layer (311), or on each of both the top and bottom of the LLO layer.

Meanwhile, it is preferred that, in between the first layer and the LLO layer, there is formed an undoped semiconductor layer on at least one or more surfaces out of the top and bottom of the LLO layer (311).

As described above, according to the present invention, an LLO layer is formed between a substrate and a light emitting structure and is then removed by means of irradiation of a laser beam thereon so as to separate the substrate. Thus, there are advantages in that the substrate can be re-used, an interface of the light emitting structure with which the LLO layer was in contact can be smooth, and manufacturing costs can be reduced.

Furthermore, according to the present invention, an LLO layer and an epi-layer are formed on a nitride semiconductor substrate, and the nitride semiconductor substrate is then separated through a laser lift-off process, thereby improving the characteristics of the epi-layer and enabling fabrication of a high-grade and high-efficiency light emitting diode.

Although the present invention has been described in detail in connection with the preferred embodiments, it is not limited thereto. It will be readily understood by those skilled in the art that various modifications and changes can be made thereto without departing from the spirit and scope of the present invention, and such modifications and changes fall within the scope of the invention defined by the appended claims.

What is claimed is:

1. A method of manufacturing a light emitting diode, comprising:

forming a laser lift-off (LLO) layer comprising at least one of GaN, InGaN, AlGaN and InAlGaN on a nitride semiconductor substrate;

forming a first semiconductor layer on the laser lift-off layer;

forming an active layer and a second semiconductor layer on the first semiconductor layer;

bonding a carrier to a surface of the second semiconductor layer;

carrying out a laser lift-off process in which the laser beam is irradiated on the LLO layer through the nitride semiconductor substrate to separate the nitride semiconductor substrate;

forming a metallic support on of the first semiconductor layer on which the nitride semiconductor substrate is separated;

removing the carrier formed on the surface of the second semiconductor layer;

forming a first electrode on the surface of the second semiconductor layer on which the carrier is removed; and forming a second electrode on the metallic support, wherein the LLO layer is completely removed by irradiating the laser beam, wherein the carrier comprises any one of a glass substrate, a sapphire substrate, a silicon substrate, a ZnO substrate, and a nitride semiconductor substrate, or a template substrate in which at least one of GaN, InGaN, AlGaN, and AlInGaN is laminated on anyone of a glass substrate, a sapphire substrate, a silicon substrate, a ZnO substrate, and a nitride semiconductor substrate.

2. The method as claimed in claim 1, between the steps of forming the laser lift-off (LLO) layer and of forming the first semiconductor layer on the nitride semiconductor substrate, further comprising forming an undoped semiconductor layer on an upper surface and/or a lower surface of the LLO layer.

3. The method as claimed in claim 1, wherein the LLO layer has a thickness in the range of 1 Å-3 um.

4. The method as claimed in claim 1, wherein the LLO layer has an energy band gap greater than that of the nitride semiconductor substrate but smaller than that of the active layer.

5. The method as claimed in claim 1, wherein the lager beam has a wavelength shorter than that corresponding to the band gap energy of the LLO layer but longer than that corresponding to the band gap energy of the nitride semiconductor substrate.

6. The method as claimed in claim 1, wherein the first and second semiconductor layers comprise GaN.

7. The method as claimed in claim 1, further comprising forming a UBM layer on the first electrode and forming a reflective layer between the first electrode and the UBM layer, wherein the reflective layer comprises at least one selected from Ag, Al, Pt, Au, Ni, Ti and transmissive conductive oxide or a combination thereof.

8. The method as claimed in claim 1, wherein the nitride semiconductor substrate is one of a GaN, an InGaN, an AlGaN or AlInGaN substrate, or a template substrate in which at least one of GaN, InGaN, AlGaN and AlInGaN is laminated on any one at least one of a sapphire substrate, a silicon substrate, a ZnO substrate and a nitride semiconductor substrate.

9. The method as claimed in claim 8, wherein any one thickness of GaN, InGaN, AlGaN and AlInGaN laminated on the template substrate has a thickness of 0.001-100 um.

10. The method as claimed in claim 7, further comprising bonding a sub-mount to the UBM layer, wherein the sub-mount is fabricated by forming ohmic-contact materials on top and bottom surfaces of a conductive substrate and forming a solder on the ohmic-contact material formed on the top surface of the conductive substrate.

11. The method as claimed in claim 10, wherein the conductive substrate comprises at least any one of Si, AlN, SiC, GaAs, Cu, W and Mo.

12. The method as claimed in claim 1, wherein the metallic support is formed by anyone method of an electroplating method, an electro less plating method, a CVD method, a sputtering method and an evaporating method.

13. The method as claimed in claim 1, wherein the metallic support has a thickness in the range of 10-400 μm.

14. The method as claimed in claim 1, wherein the metallic support comprises at least one selected from a group consisting of Cu, W, Au, Ni, Mo, Pt, Al, Co, Pd, Ag and Ti.

15. The method as claimed in claim 2, wherein a distance between the LLO layer and the nitride semiconductor substrate is in the range of 1-10 μm, when the undoped semiconductor layer is formed on the top of the LLO layer or the bottom of the LLO layer.

16. The method as claimed in claim 1, wherein the carrier is bonded to the surface of the second semiconductor layer using an adhesive substance and is removed from the surface of the second semiconductor layer using an organic solvent.

17. The method as claimed in claim 16, wherein the adhesive substance is photoresist or wax.

* * * * *